United States Patent
Lee

(10) Patent No.: US 7,532,063 B2
(45) Date of Patent: May 12, 2009

(54) APPARATUS FOR GENERATING REFERENCE VOLTAGE IN SEMICONDUCTOR MEMORY APPARATUS

(75) Inventor: Ki-Won Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 55 days.

(21) Appl. No.: 11/600,769

(22) Filed: Nov. 17, 2006

(65) Prior Publication Data

US 2007/0120593 A1    May 31, 2007

(30) Foreign Application Priority Data

Nov. 29, 2005    (KR) .................. 10-2005-0115075

(51) Int. Cl.
*G05F 1/10* (2006.01)
*G05F 3/02* (2006.01)
(52) U.S. Cl. .................. 327/539; 327/538; 327/543; 327/512; 327/513; 323/311; 323/312; 323/313; 323/314; 323/315; 323/316; 323/317
(58) Field of Classification Search .............. 327/538, 327/539, 543, 512, 513; 323/311–317
See application file for complete search history.

(56) References Cited

U.S. PATENT DOCUMENTS 6,078,208 A * 6/2000 Nolan et al. ................ 327/512

| | | | |
|---|---|---|---|
| 6,501,299 B2 * | 12/2002 | Kim et al. .................. 326/83 |
| 6,791,308 B2 | 9/2004 | Shim |
| 6,900,689 B2 | 5/2005 | Kimura |
| 2005/0134365 A1 | 6/2005 | Kimura |
| 2005/0174164 A1 | 8/2005 | Fuhrmann et al. |

FOREIGN PATENT DOCUMENTS

| JP | 10290144 | 10/1998 |
| KR | 1019980078853 A | 11/1998 |
| KR | 1020000003335 A | 1/2000 |
| KR | 1020060065468 A | 6/2006 |

OTHER PUBLICATIONS

Taiwan Office Action dated Nov. 25, 2008.

* cited by examiner

*Primary Examiner*—Kenneth B Wells
*Assistant Examiner*—John W Poos
(74) *Attorney, Agent, or Firm*—Venable LLP; Jeffri A. Kaminski

(57) ABSTRACT

An apparatus for generating a reference voltage in a semiconductor memory apparatus according includes: a first voltage generating unit configured to generate a voltage proportional to temperature; a second voltage generating unit configured to generate a voltage inversely proportional to temperature; and a reference voltage generating unit including a first adjusting unit connected with the first voltage generating unit and a second adjusting unit connected with the second voltage generating unit, configured to select the first adjusting unit or the second adjusting unit according to a difference between a reference voltage obtained by the first voltage generating unit and the second voltage generating unit and a target voltage, and adjust the reference voltage thereby outputting a constant reference voltage regardless of a variation in temperature.

36 Claims, 10 Drawing Sheets

APPARATUS FOR GENERATING REFERENCE VOLTAGE IN SEMICONDUCTOR MEMORY APPARATUS

BACKGROUND

1. Technical Field

The present invention relates to a semiconductor memory apparatus, and more particularly, to an apparatus for generating a reference voltage in a semiconductor memory apparatus.

2. Related Art

As shown in FIG. 1, an apparatus for generating a reference voltage in a semiconductor memory apparatus according to the related art includes a first voltage generating unit 10 for generating a voltage that is proportional to temperature, a second voltage generating unit 20 for generating a voltage that is inversely proportional to temperature, a current mirror including a transistor M1 having a source connected to a power supply terminal of the first voltage generating unit 10 and a transistor K1 having a source connected to a power supply terminal of the second voltage generating unit 20, and a resistor R3 that has one end connected to the drains of the transistors M1 and K1 and the other end connected to the ground, and that outputs a reference voltage VREF. As is well known, the reference voltage is obtained by currents of the first and second voltage generating unit 10 and 20.

The operation of the apparatus according to the related art will be described below.

The first voltage generating unit 10 for generating a voltage proportional to temperature is a bandgap-type circuit, and generates a voltage using a difference in base-emitter voltage (VBE) of a bipolar junction transistor (BJT). The difference in base-emitter voltage is proportional to a thermal voltage (VT). When the thermal voltage is differentiated with respect to temperature, the differentiated value has a positive temperature coefficient. For example, the positive temperature coefficient may be 0.087 mV/K. In this case, VT=kT/q, where k is the Boltzmann constant ($1.380622 \times 10^{-23}$ J·K$^{-1}$), T is an absolute temperature, and q=$1.6 \times 10^{-19}$ C.

Meanwhile, the second voltage generating unit 20 for generating a voltage inversely proportional to temperature has the same voltage generating method as the first voltage generating unit 10 for generating a voltage proportional to temperature. In this case, the second voltage generating unit 20 has a negative temperature coefficient of, for example, −2.1 mV/K.

The above-mentioned temperature coefficient is just an illustrative example. Both the first voltage generating unit 10 for generating a voltage proportional to temperature and the second voltage generating unit 20 for generating a voltage inversely proportional to temperature use bipolar junction transistors, and the absolute value of the temperature coefficient of the second voltage generating unit 20 for generating a voltage inversely proportional to temperature is considerably larger than that of the first voltage generating unit 10 for generating a voltage proportional to temperature.

As described above, a current having a zero temperature coefficient (ZTC), that is, a current that is constant regardless of temperature is generated by combining the output of the first voltage generating unit 10 for generating a voltage proportional to temperature with the output of the second voltage generating unit 20 for generating a voltage inversely proportional to temperature using a coefficient of the current mirror, that is, the ratio (XM:XK) of the size of the transistor M1 and the size of the transistor K1.

In addition, the current having ZTC passes through the resistor R3, which causes a constant reference voltage to be generated regardless of temperature.

The reference voltage VREF can be expressed as follows: VREF=M*R3/R1(VT*1nN)+K*R3/R2*VBE.

In the above-mentioned expression, M and K are coefficients of the transistors M1 and K1 forming the current mirror, and may vary when mismatching occurs in the circuit design or vary due to the difference between element characteristics even when mismatching does not occur, which may have an effect on ZTC. In addition, N is a coefficient of the bipolar junction transistor.

Considering the offset voltages VOFFSET of operational amplifiers 11 and 21 of the first voltage generating unit 10 for generating a voltage proportional to temperature and the second voltage generating unit 20 for generating a voltage inversely proportional to temperature, the reference voltage VREF can be expressed as follows: VREF=M*R3/R1(VT*1nN)+K*R3/R2*VBE+M*R3/R1*VOFFSET+K*R3/R2*VOFFSET.

As can be seen from the above-mentioned expression, according to the related art, the offset voltages of the operational amplifiers as well as the coefficients M and K of the transistors have an effect on ZTC. As a factor included in the expression, the resistor R3 for outputting a voltage has a temperature coefficient, which may have an effect on ZTC.

As described above, in the apparatus for generating a reference voltage in a semiconductor memory apparatus according to the related art, it is difficult to generate a constant reference voltage regardless of a variation in temperature due to current control elements having fixed temperature coefficients and various factors, such as the offset voltages of the operational amplifiers and the resistor. As a result, the related art has a problem in that the reference voltage is unstable, which causes the performance and reliability of a system using the apparatus for generating a reference voltage in a semiconductor memory apparatus to deteriorate.

SUMMARY

Embodiments of the present invention provide an apparatus for generating a reference voltage in a semiconductor memory apparatus capable of generating a constant reference voltage regardless of a variation in temperature and a mismatch between elements. According to an embodiment of the present invention, there is provided an apparatus for generating a reference voltage in a semiconductor memory apparatus. The apparatus includes: a first voltage generating unit configured to generate a voltage proportional to temperature; a second voltage generating unit configured to generate a voltage inversely proportional to temperature; and a reference voltage generating unit including a first adjusting unit connected with the first voltage generating unit and a second adjusting unit connected with the second voltage generating unit, configured to select the first adjusting unit or the second adjusting unit according to a difference between a reference voltage obtained by the first voltage generating unit and the second voltage generating unit and a target voltage, and adjust the reference voltage thereby outputting a constant reference voltage regardless of a variation in temperature.

According to another embodiment of the present invention, there is provided an apparatus for generating a reference voltage in a semiconductor memory apparatus. The apparatus includes: a first voltage generating unit configured to generate a voltage proportional to temperature; a second voltage generating unit configured to generate a voltage inversely proportional to temperature; and a reference voltage generating unit including a first adjusting unit connected with the first voltage generating unit and a second adjusting unit connected with the second voltage generating unit, configured to operate both the first adjusting unit and the second adjusting unit according to a difference between a reference voltage obtained by the first voltage generating unit and the second voltage generating unit and a target voltage, and adjust the reference voltage, thereby outputting a constant reference voltage regardless of a variation in temperature, wherein the first adjusting unit is configured to finely adjust the reference voltage and the second adjusting unit is configured to coarsely adjust the reference voltage.

DESCRIPTION OF EXEMPLARY EMBODIMENT

Hereinafter, apparatuses for generating a reference voltage in a semiconductor memory apparatus according to preferred embodiments of the present invention will be described in detail with reference to the accompanying drawings.

First Embodiment

Figure 1:
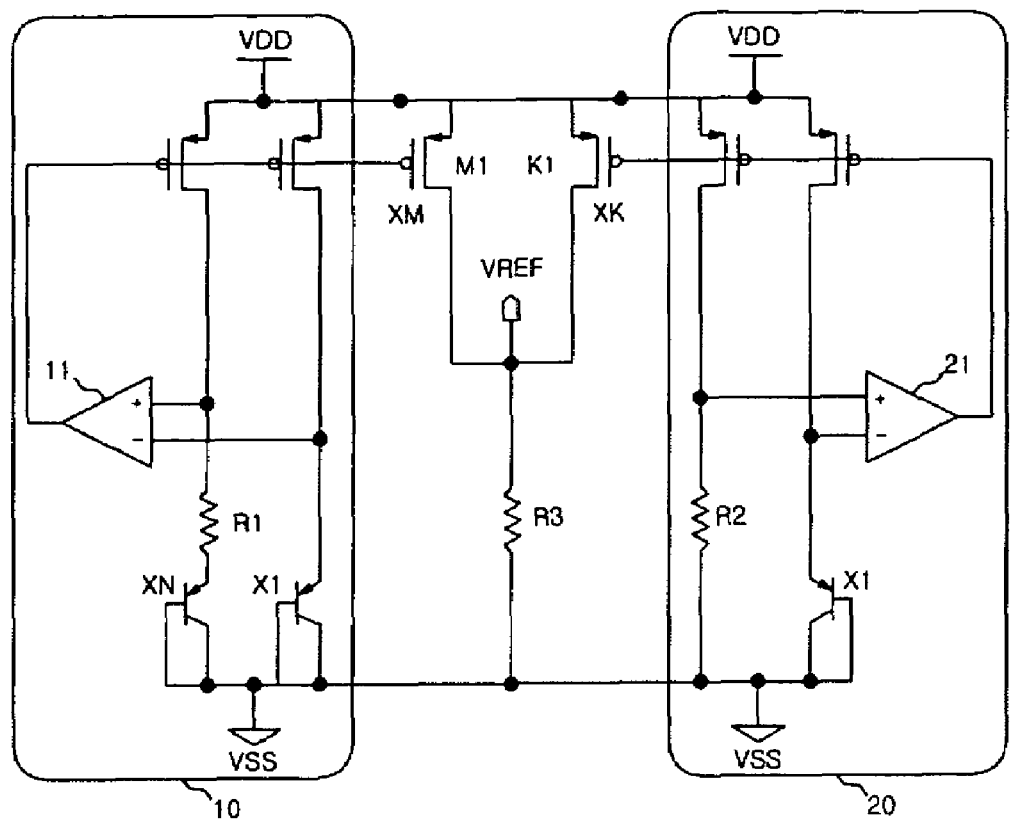
FIG. 1 is a circuit diagram illustrating the structure of an apparatus for generating a reference voltage in a semiconductor memory apparatus according to the related art.
Figure 2:
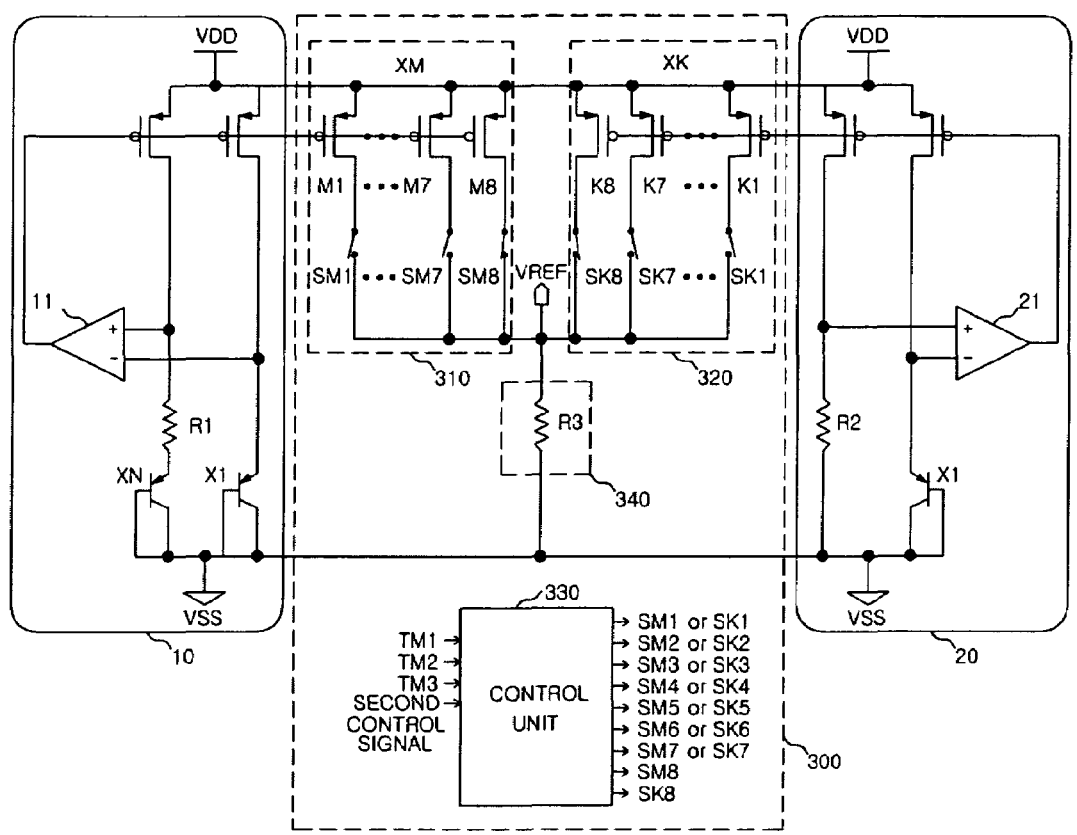
FIG. 2 is a circuit diagram illustrating the structure of an apparatus for generating a reference voltage in a semiconductor memory apparatus according to a first embodiment of the present invention.

As shown in FIG. 2, the apparatus for generating a reference voltage in a semiconductor memory apparatus according to the first embodiment of the present invention includes a first voltage generating unit 10 for generating a voltage proportional to temperature, a second voltage generating unit 20 for generating a voltage inversely proportional to temperature, and a reference voltage generating unit 300.

The first voltage generating unit 10 and the second voltage generating unit may be same that of the related art.

The reference voltage generating unit 300 includes a first adjusting unit 310 coupled with the first voltage generating unit 10, a second adjusting unit 320 coupled with the second voltage generating unit 20, a control unit 330 that outputs a selection signal for controlling the first adjusting unit 310 or the second adjusting unit 320, and a reference voltage output unit 340 that outputs a reference voltage based on the amount of current adjusted by the first adjusting unit 310 and the amount of current adjusted by the second adjusting unit 320.

The first adjusting unit 310 includes a plurality of current control elements, that is, transistors M1 to M8 connected between a power supply terminal of the first voltage generating unit 10 and the reference voltage output unit 340 through switching elements SM1 to SM8. The second adjusting unit 320 includes a plurality of current control elements, that is, transistors K1 to K8 connected between a power supply terminal of the second voltage generating unit 20 and the reference voltage output unit 340 through switching elements SK1 to SK8. In this case, the switching elements SM1 to SM8 and SK1 to SK8 may be formed of transistors each having a gate to which the selection signal output from the control unit 330 is input.

The transistors M1 to M8 of the first adjusting unit 310 have different sizes, that is, different resistance values, and the transistor (for example, M8) having an intermediate resistance value is set as a reference transistor for generating an initial reference voltage. Similarly, the transistors K1 to K8 of the second adjusting unit 320 have different sizes, that is, different resistance values, and the transistor (for example, K8) having an intermediate resistance value is set as a reference transistor for generating an initial reference voltage.

The resistance values of the transistors M1 to M8 and K1 to K8 are already known to an operator, and the transistors M1 to M7 and K1 to K7 other than the reference transistors M8 and K8 may be connected in series to one another either in the ascending or descending order of resistance values.

As described in the related art, the absolute value of a temperature coefficient (for example, −2.1 mV/K) of the second voltage generating unit 20 is considerably larger than the absolute value of a temperature coefficient (for example, 0.087 mV/K) of the first voltage generating unit 10. Therefore, the first adjusting unit 310 finely adjusts a reference voltage and the second adjusting unit 320 coarsely adjusts a reference voltage.

Figure 3:
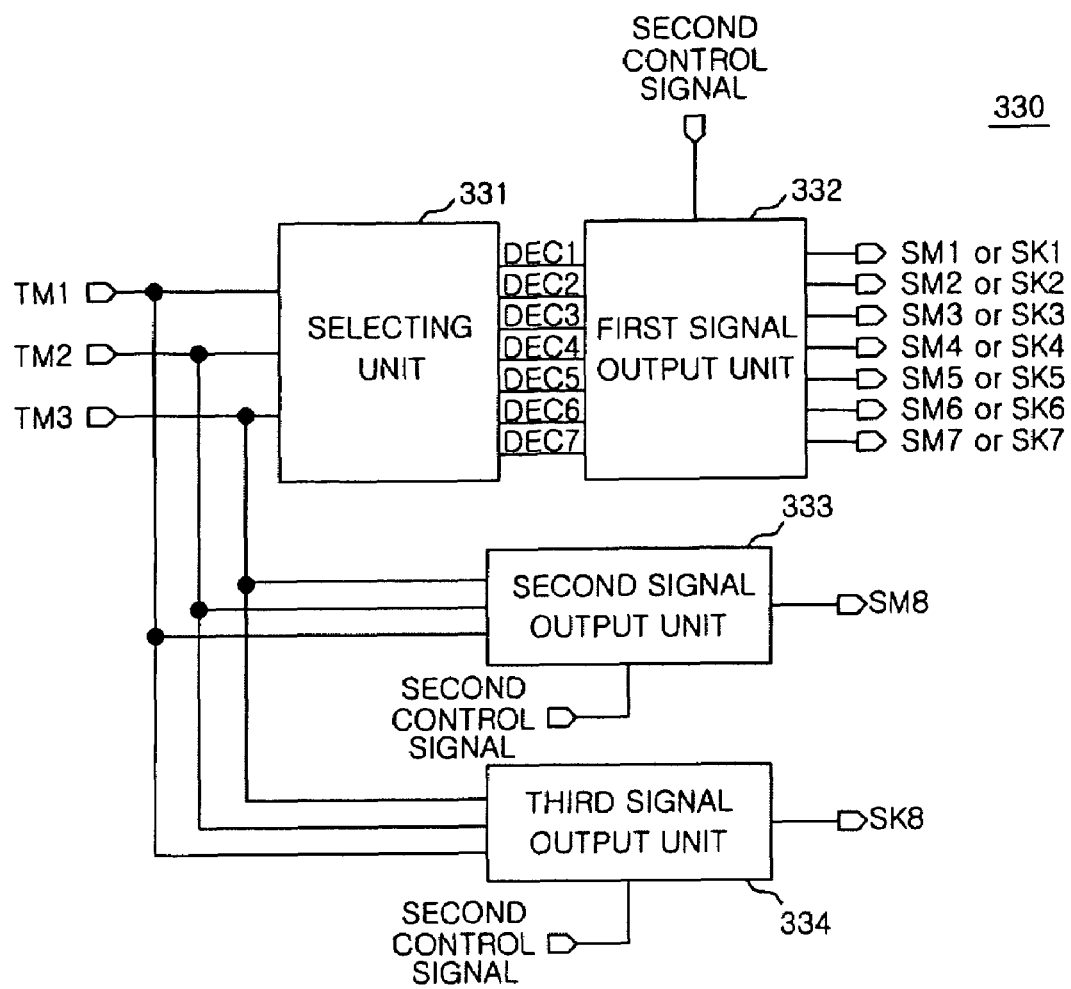
FIG. 3 is a block diagram illustrating the structure of a control unit shown in FIG. 2.

As shown in FIG. 3, the control unit 330 includes a selecting unit 331 that generates selection signals DEC1 to DEC7 by a predetermined level on the basis of first control signals TM1 to TM3; a first signal output unit 332 that outputs the selection signals DEC1 to DEC7 to the first adjusting unit 310 or the second adjusting unit 320 on the basis of a second control signal; a second signal output unit 333 that generates a first reference selection signal for driving the reference transistor M8 of the first adjusting unit 310 on the basis of the first control signals TM1 to TM3 and the second control signal, and outputs the generated first reference selection signal; and a third signal output unit 334 that generates a second reference selection signal for driving the reference transistor K8 of the second adjusting unit 320 on the basis of the first control signals TM1 to TM3 and the second control signal, and outputs the generated second reference selection signal.

The selecting unit 331 is a decoder. The selecting unit 331 converts the first control signal of 3 bits into a decimal value, changes a selection signal corresponding to the converted decimal value to a high level, changes the other selection signals to low levels, and outputs the selection signals. For example, when the first control signals TM1, TM2, and TM3 have binary values of 0, 0, and 1, respectively, and thus the decimal value thereof is 1, the selection signal DEC1 is output at a high level, and the selection signals DEC2 to DEC7 are output at low levels. However, the decimal value of the first control signals is set to 0 (TM1=0, TM2=0, and TM3=0) during a default operation for determining an initial reference value. In this case, the selection signals DEC0 to DEC7 output from the selecting unit 331 are all at low level.

Figure 4A:
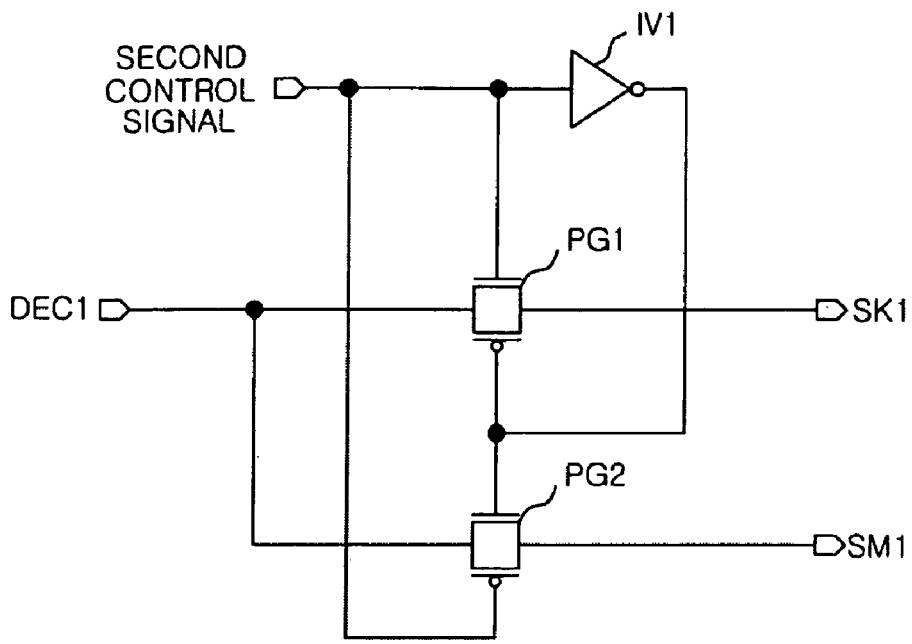
FIG. 4A is a circuit diagram illustrating the structure of a first signal output unit show in FIG. 3.

Since the first signal output unit 332 has to output the selection signals DEC1 to DEC7 to the first adjusting unit 310 or the second adjusting unit 320, seven circuit structures shown in FIG. 4A are needed. FIG. 4A is a diagram illustrating an example of a circuit structure for outputting the selection signal DEC0 among the selection signals. As shown in FIG. 4A, the circuit structure includes a first transfer element, that is a pass gate PG1, for outputting the selection signal DEC1 to the corresponding switching element SK1 of the second adjusting unit 320 on the basis of the second control signal and an inverted signal of the second control signal that is inverted by a first inverter IV1; and a second transfer element, that is a pass gate PG2, for outputting the selection signal DEC0 to the corresponding switching element SM1 of the first adjusting unit 310 on the basis of the second control signal, and the inverted signal of the second control signal that is inverted by the first inverter IV1. In FIG. 4A, when the second control signal is at a low level, the first adjusting unit 310 is selected. On the other hand, when the second control signal is at a high level, the second adjusting unit 320 is selected. The selection of the first and second adjusting units 310 and 320 may be changed by a simple variation in circuit structure.

Figure 4B:
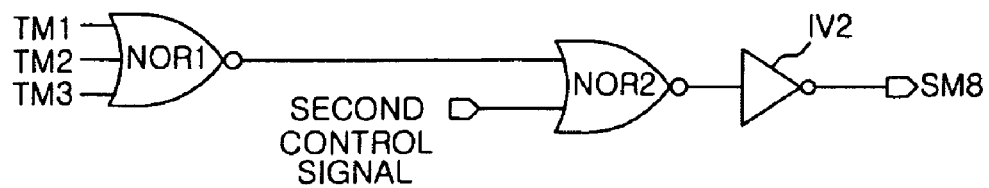
FIG. 4B is a circuit diagram illustrating the structure of a second signal output unit show in FIG. 3.

As shown in FIG. 4B, the second signal output unit 333 is formed of a logic circuit that turns on the switching element SM8 connected to the reference transistor M8 of the first adjusting unit 310 when the decimal value of the first control signals is zero and when the second adjusting unit 320 is selected by the second control signal although the decimal value of the first control signals is not zero. The circuit structure shown in FIG. 4B includes a first NOR gate NOR1 to which the first control signals are input, a second NOR gate NOR2 to which the output of the first NOR gate NOR1 and the second control signal are input, and a second inverter IV2 that inverts the output of the second NOR gate NOR2 and outputs the inverted signal to the switching element SM8.

Figure 4C:
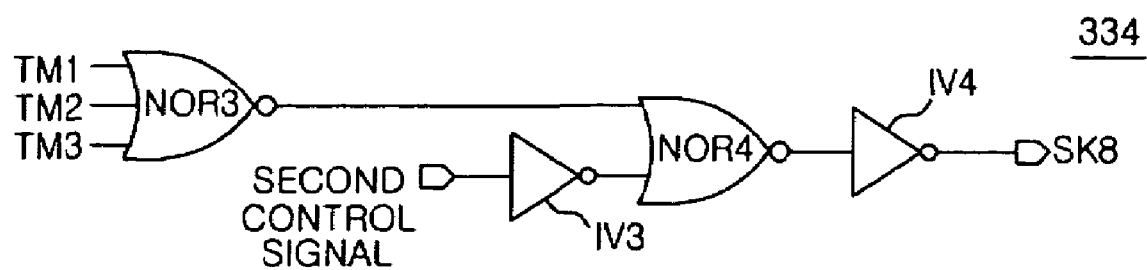
FIG. 4C is a circuit diagram illustrating the structure of a third signal output unit show in FIG. 3.

As shown in FIG. 4C, the third signal output unit 334 is formed of a logic circuit that turns on the switching element SK8 connected to the reference transistor K8 of the second adjusting unit 320 when the decimal value of the first control signals is zero and when the first adjusting unit 310 is selected by the second control signal although the decimal value of the first control signals is not zero. The circuit structure shown in FIG. 4C includes a third NOR gate NOR3 to which the first control signals are input, a fourth NOR gate NOR4 to which the output of the third NOR gate NOR3 and an inverted signal of the second control signal that is inverted by a third inverter IV3 are input, and a fourth inverter IV4 that inverts the output of the fourth NOR gate NOR4 and outputs the inverted signal to the switching element SK8.

The reference voltage output unit 340 (refer to FIG. 2) includes a resistor R3 having one end connected to both the first adjusting unit 310 and the second adjusting unit 320 and the other end connected to the ground to which the first voltage generating unit 10 and the second voltage generating unit 20 are connected.

Next, the operation of the first embodiment having the above-mentioned structure will be described below.

First, the operator determines whether a reference voltage VREF satisfies a zero temperature coefficient (ZTC) in an initial state before an adjusting operation, that is, whether a target voltage is output regardless of temperature. Therefore, the logical values of the first control signals TM1, TM2, and TM3 are all set to zero, and the second control signal may have any level from the viewpoint of the circuit structure shown in FIG. 3. In this case, a test mode may be used to set the first control signals and the second control signal.

The selecting unit 331 shown in FIG. 3 outputs the output signals DEC1 to DEC7 having low levels since the logical values of the first control signals TM1, TM2, and TM3 are all set to zero. Therefore, no signals having a high level are output from the first signal output unit 332 to the switching elements SM1 to SM7 and SK1 to SK7.

Meanwhile, the first NOR gate NOR1 of the second signal output unit 333 and the third NOR gate NOR3 of the third signal output unit 334 output high-level signals since they receive the first control signals having logical values of 0. The second inverter IV2 of the second signal output unit 333 and the fourth inverter IV4 of the third signal output unit 334 output high-level signals to the switching element SM8 and SK8, respectively, regardless of the level of the second control signal. Then, the switching elements SM8 and SK8 are turned on, which causes the reference transistors M8 and K8 to be connected to the reference voltage output unit 340 to adjust the amount of current on the basis of their resistance values. The reference voltage output unit 340 outputs the reference voltage VREF.

Figure 5A:
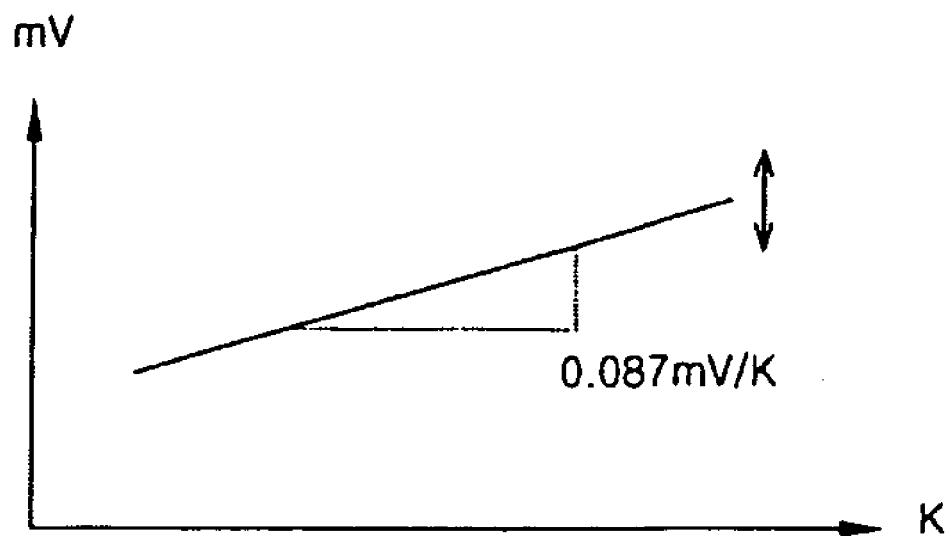
FIGS. 5A to 5D are graphs illustrating a method of adjusting a reference voltage according to an exemplary embodiment of the present invention.
Figure 5B:
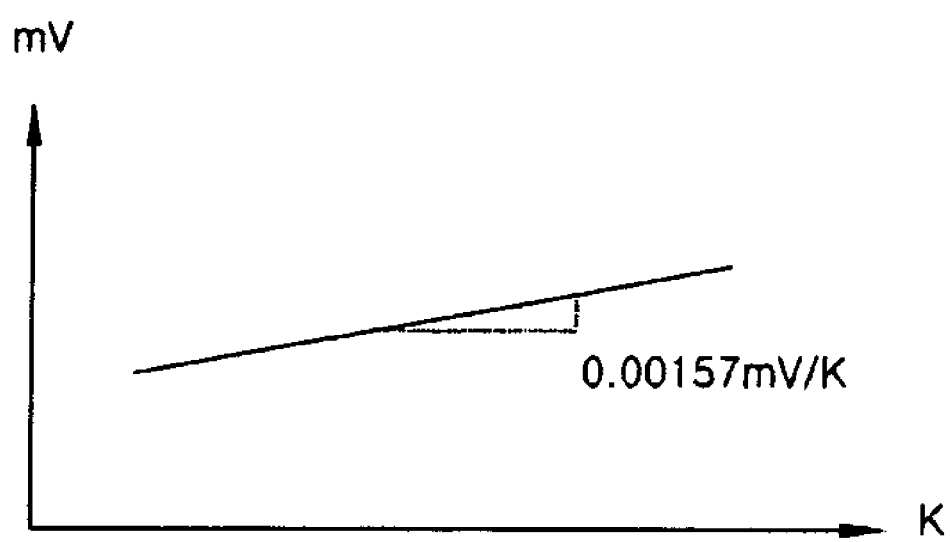
Figure 5C:
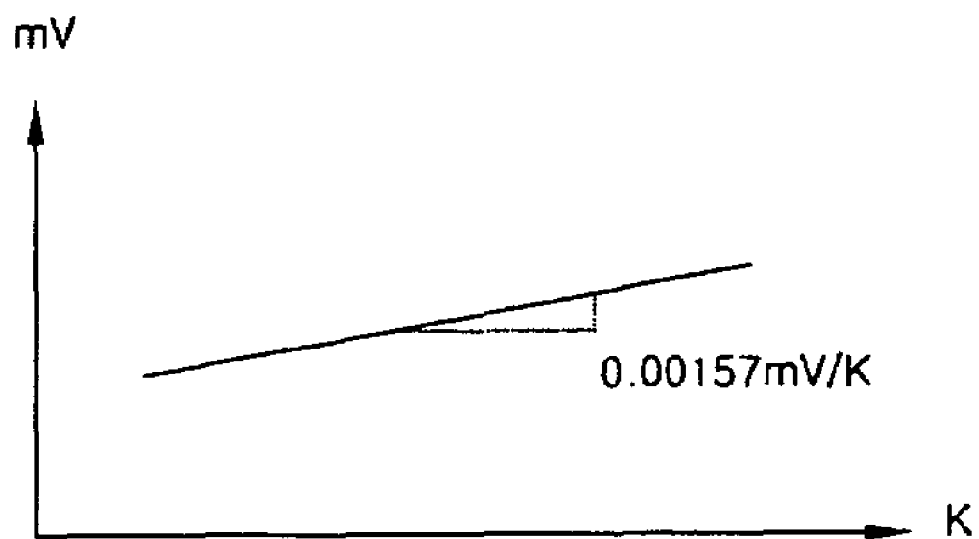

Subsequently, the operator determines whether the reference voltage VREF is equal to the target voltage. In this case, the first voltage generating unit 10 may exhibit a voltage output characteristic shown in FIG. 5A according to temperature coefficients, and the resistor R3 of the reference voltage output unit 340 may exhibit a voltage output characteristic shown in FIG. 5B. In addition, the second voltage generating unit 20 may exhibit a voltage output characteristic shown in FIG. 5C according to temperature coefficients. Therefore, even when the reference transistors M8 and K8 are exactly matched with each other, the reference voltage VREF finally output may be different from the target voltage due to various factors, such as the difference between the temperature coefficients and the resistance values of the reference transistors M8 and K8.

Therefore, when the reference voltage VREF is not equal to the target voltage, the operator determines whether to adjust the reference voltage VREF using the first adjusting unit 310 or the second adjusting unit 320 on the basis of the difference between the voltages.

That is, when the operator determines that the difference between the reference voltage VREF and the target voltage is not large, that is the difference is smaller than a predetermined value, the operator controls the first adjusting unit 310 to adjust the reference voltage. On the other hand, when the operator determines that the difference between the reference voltage VREF and the target voltage is large, that is the difference is higher that the predetermined value, the operator controls the second adjusting unit 320 to adjust the reference voltage. That is, the operator determines whether the difference between the voltages is in the range that can be adjusted by the first adjusting unit 310 or in the range that can be adjusted by the second adjusting unit 320.

Further, when the difference between the reference voltage and the target voltage has a positive value, that is, when the reference voltage VREF is higher than the target voltage, the reference voltage VREF should be lowered by the difference between the voltages. Since the resistance values of the transistors are already known, the transistors having larger resistance values than the reference transistors M8 and K8 are connected to the reference voltage output unit 340 such that the amount of current corresponding to the difference between the voltages can be reduced. In contrast, when the difference between the reference voltage and the target voltage has a negative value, that is, when the reference voltage VREF is lower than the target voltage, the reference voltage VREF should be raised by the difference between the voltages. Since the resistance values of the transistors are already known, the transistors having smaller resistance values than the reference transistors M8 and K8 are connected to the reference voltage output unit 340 such that the amount of current corresponding to the difference between the voltages can be increased.

Meanwhile, when the difference between the reference voltage VREF and the target voltage is large, the second adjusting unit 320 should be controlled to adjust the reference voltage VREF. An operation of adjusting the reference voltage VREF will be described below on the assumption that the transistor K1 of the second adjusting unit 320 has a resistance value capable of compensating for the difference between the voltages.

The operator sets the logical values of the first control signals TM1, TM2, and TM3 to 0, 0, and 1, respectively, and sets the second control signal to a high level. In this case, a test mode may be used to set the first and second control signals.

The selecting unit 331 shown in FIG. 3 decodes the first control signals and outputs the selection signal DEC1 having a high level and the selection signals DEC2 to DEC7 having low levels.

Then, the first signal output unit 332 outputs the high-level selection signal DEC1 to the switching element SK1 of the second adjusting unit 320 on the basis of the second control signal to turn on the switching element SK1, which causes the transistor K1 to be connected to the reference voltage output unit 340. At that time, since the first control signals TM1, TM2, and TM3 have logical values of 0, 0, and 1, respectively, the third NOR gate NOR3 of the third signal output unit 334 outputs a low-level signal, and the second control signal is inverted to a low level by the third inverter IV3. Therefore, the fourth NOR gate NOR4 outputs a high-level signal, and a low-level signal is output from the fourth inverter IV4 to the switching element SK8. As a result, the transistor M8 is disconnected from the reference voltage output unit 340.

Meanwhile, since the first control signals TM1, TM2, and TM3 have logical values of 0, 0, and 1, respectively, the first NOR gate NOR1 of the second signal output unit 333 outputs a low-level signal, and the second control signal is at a high level. Therefore, the second NOR gate NOR2 outputs a low-level signal, and a high-level signal is output from the second inverter IV2 to the switching element SM8. As a result, the connection between the transistor M8 and the reference voltage output unit 340 is maintained.

Therefore, the transistor M8 of the first adjusting unit 310 and the transistor K8 of the second adjusting unit 320 are connected to the reference voltage output unit 340, so that they perform current control operations according to their resistance values. As a result, the reference voltage VREF having a ZTC characteristic that is constant regardless of temperature is output, as shown in FIG. 5D.

Figure 5D:
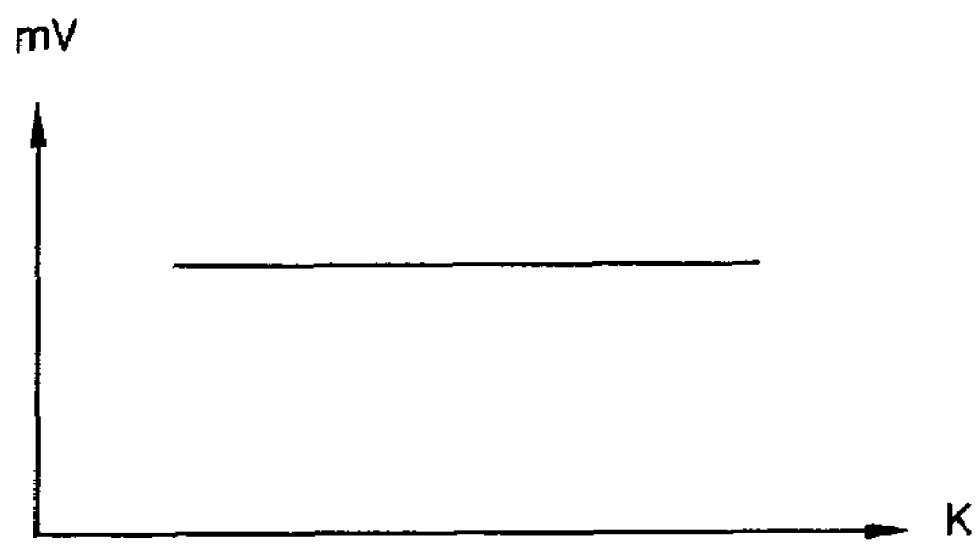

In this embodiment, it is possible to obtain the reference voltage VREF shown in FIG. 5D by performing the adjusting operation only once since the difference between the voltages is checked by using the reference transistors M8 and K8 of the first adjusting unit 310 and the second adjusting unit 320 and the transistors whose resistance values are already known are connected to the reference voltage output unit 340 to perform the reference voltage adjusting operation. However, in other cases, it is possible to obtain the reference voltage VREF shown in FIG. 5D since only a simple change in control signal makes it possible to repeatedly perform the adjusting operation.

Second Embodiment

Figure 6:
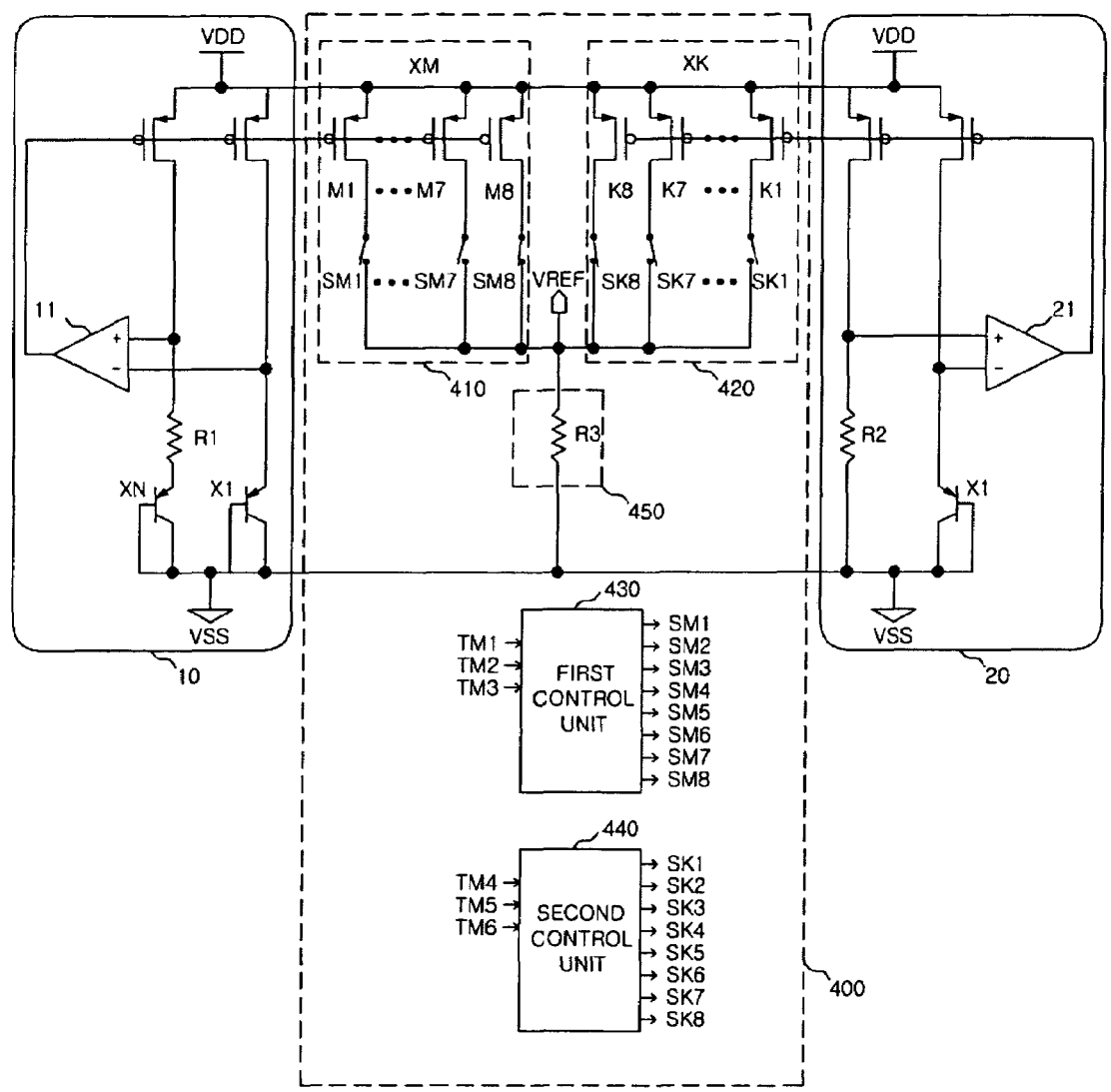
FIG. 6 is a circuit diagram illustrating the structure of an apparatus for generating a reference voltage in a semiconductor memory apparatus according to a second embodiment of the present invention.

As shown in FIG. 6, an apparatus for generating a reference voltage in a semiconductor memory apparatus according to a second embodiment of the present invention includes a first voltage generating unit 10 for generating a voltage proportional to temperature, a second voltage generating unit 20 for generating a voltage inversely proportional to temperature, and a reference voltage generating unit 400 for outputting a constant reference voltage regardless of a variation in temperature.

The reference voltage generating unit 400 includes a first adjusting unit 410, a second adjusting unit 420 a first control unit 430 that outputs selection signals for controlling the first adjusting unit 410, a second control unit 440 that outputs selection signals for controlling the second adjusting unit 420, and a reference voltage output unit 450 that is composed of a resistor R3, and which outputs a reference voltage based on the amount of current adjusted by the first adjusting unit 410 and the amount of current adjusted by the second adjusting unit 420.

In this embodiment, the structure of the first and second adjusting units 410 and 420 is the same as that in the first embodiment shown in FIG. 2, and thus a detailed description thereof will be omitted.

Figure 7A:
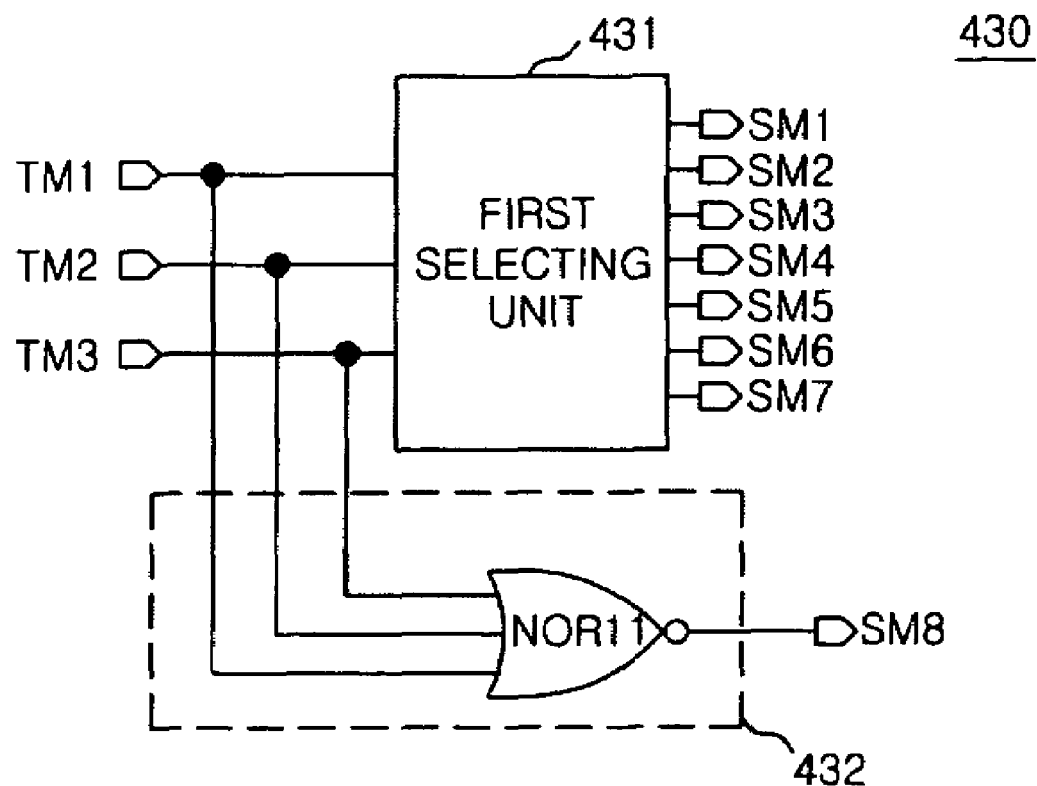
FIG. 7A is a block diagram illustrating the structure of a first control unit shown in FIG. 6.

Referring to FIG. 7A, the first control unit 430 includes a first selecting unit 431 that outputs selection signals on the basis of first control signals TM1 to TM3 and a second selecting unit 432 that outputs a first reference selection signal for driving a switching element SM8 which connects a reference transistor M8 to the reference voltage output unit 450 when the first control signals TM1 to TM3 have predetermined values.

The first selecting unit 431 is a decoder. The first selecting unit 431 converts the first control signals into a decimal value, changes a selection signal corresponding to the converted decimal value to a high level, changes the other selection signals to low levels, and outputs the selection signals.

For example, when the first control signals TM1, TM2, and TM3 have binary values of 0, 0, and 1, respectively, and thus the decimal value thereof is 1, a high-level signal is output to a switching element SM1 and low-level signals are output to switching elements SM2 to SM7. However, the decimal value of the first control signals is set to 0 (TM1=0, TM2=0, and TM3=0) during an initial reference voltage determining operation. When the decimal value is zero, the signals output from the first selecting unit 431 to the switching elements SM1 to SM7 are all at low levels. The second selecting unit 432 is formed of a NOR gate NOR11. A high-level signal is output to a switching element SM8 only when the decimal value of the first control signals is zero. That is, a reference transistor M8 connected to the switching element SM8 is connected to the reference voltage output unit 450 during the initial reference voltage determining operation.

Figure 7B:
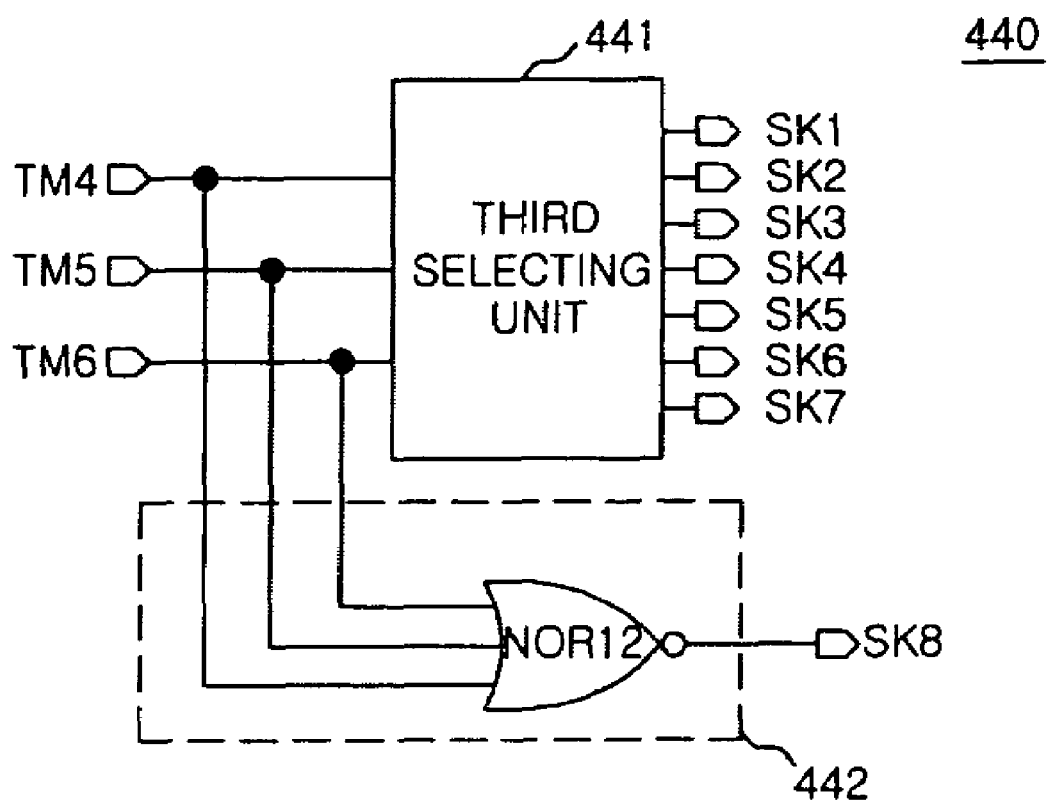
FIG. 7B is a block diagram illustrating the structure of a second control unit shown in FIG. 6.

Turning to FIG. 7B, the second control unit 440 includes a third selecting unit 441 that outputs selection signals on the basis of second control signals TM4 to TM6 and a fourth selecting unit 442 that outputs a second reference selection signal for driving a switching element SK8 which connects a reference transistor K8 to the reference voltage output unit 450 when the second control signals TM4 to TM6 have predetermined values.

The third selecting unit 441 is a decoder. The third selecting unit 441 converts the second control signals TM4 to TM6 into a decimal value, changes a selection signal corresponding to the converted decimal value to a high level, changes the other selection signals to low levels, and outputs the selection signals.

For example, when the second control signals TM4, TM5, and TM6 have binary values of 0, 0, and 1, respectively, and thus the decimal value thereof is 1, a high-level signal is output to a switching element SK1, and low-level signals are output to switching elements SK2 to SK7. However, the decimal value of the second control signals is set to 0 (TM4=0, TM5=0, and TM6=0) during the initial reference voltage determining operation. When the decimal value is zero, the signals output from the third selecting unit 441 to the switching elements SK1 to SK7 are all at low levels.

The fourth selecting unit 442 is formed of a NOR gate NOR12. A high-level signal is output to a switching element SK8 only when the decimal value of the second control signals is zero. That is, a reference transistor K8 connected to the switching element SK8 is connected to the reference voltage output unit 450 during the initial reference voltage determining operation.

The reference voltage output unit 450 includes the resistor R3 having one end connected to both the first adjusting unit 410 and the second adjusting unit 420 and the other end connected to the ground.

Next, the operation of the second embodiment having the above-mentioned structure will be described below.

First, the operator should determine whether the reference voltage satisfies the zero temperature coefficient (ZTC) in an initial state before an adjusting operation, that is, whether a target voltage is output regardless of temperature.

Therefore, the decimal values of the first control signals and the second control signals are all set to zero (TM1 to TM3=0, and TM4 to TM6=0). In this case, a test mode may be used to set the first control signals and the second control signals.

The first selecting unit 431 of the first selecting unit 430 shown in FIG. 7A outputs low-level signals to the switching elements SM1 to SM7 since the decimal value of the first control signals is zero (TM1=0, TM2=0, and TM3=0). In addition, the third selecting unit 441 of the second selecting unit 440 shown in FIG. 7B outputs low-level signals to the switching elements SK1 to SK7 since the decimal value of the second control signals is zero (TM4=0, TM5=0, and TM6=0).

Meanwhile, the NOR gate NOR11 of the second selecting unit 432 of the first control unit 430 outputs a high-level signal to the switching element SM8 since the logical values of the first control signals TM1, TM2, and TM3 are all zero. In addition, the NOR gate NOR12 of the fourth selecting unit 442 of the second control unit 440 outputs a high-level signal to the switching element SK8 since the logical values of the second control signals TM4, TM5, and TM6 are all zero.

Then, the switching elements SM8 and SK8 are turned on, which causes the reference transistors M8 and K8 to be connected to the resistor R3 of the reference voltage output unit 450 to perform current control operations. As a result, the reference voltage output unit 450 outputs the reference voltage VREF.

Subsequently, the operator determines whether the output reference voltage VREF is equal to the target voltage. In this case, even when the reference transistors M8 and K8 are exactly matched with each other, the reference voltage VREF finally output may be different from the target voltage due to various factors, such as the difference between the temperature coefficients and the resistance values of the reference transistors M8 and K8.

When the operator determines that the difference between the reference voltage VREF and the target voltage is very small, the operator controls the first adjusting unit 410 to finely adjust the reference voltage. On the other hand, when the operator determines that the difference between the reference voltage VREF and the target voltage is large, the operator controls the second adjusting unit 420 to coarsely adjust the reference voltage. When it is difficult to generate an exact reference voltage VREF by adjusting one of the first and second adjusting units 410 and 420, the operator controls both the first and second adjusting units 410 and 420 to adjust the reference voltage.

When the difference between the reference voltage and the target voltage has a positive value, that is, when the reference voltage VREF is higher than the target voltage, the reference voltage VREF should be lowered by the difference between the voltages. Since the resistance values of the transistors are already known, the transistors having larger resistance values than the reference transistors M8 and K8 in the first adjusting unit 410 and the second adjusting unit 420 are connected to the reference voltage output unit 450 such that the amount of current corresponding to the difference between the voltages can be reduced.

In contrast, when the difference between the reference voltage and the target voltage has a negative value, that is, when the reference voltage VREF is lower than the target voltage, the reference voltage VREF should be raised by the difference between the voltages. Since the resistance values of the transistors are already known, the transistors having smaller resistance values than the reference transistors M8 and K8 in the first adjusting unit 410 and the second adjusting unit 420 are connected to the reference voltage output unit 450 such that the amount of current corresponding to the difference between the voltages can be increased.

An operation of adjusting the reference voltage VREF will be described below on the assumption that the transistor K1 of the second adjusting unit 420 has a resistance value capable of compensating for the difference between the target voltage and the initial reference voltage, and the transistor M1 of the first adjusting unit 410 has a resistance value capable of compensating the difference between the target voltage and the reference voltage generated by adjusting the initial reference voltage using the transistor K1.

The operator sets the decimal value of the first control signals to 1 (TM1=0, TM2=0, and TM3=1), and sets the decimal value of the second control signals to 1 (TM4=0, TM5=0, and TM6=1). In this case, a test mode may be used to set the first and second control signals.

The first selecting unit 431 of the first control unit 430 decodes the first control signals and outputs a high-level signal to the switching element SM1 and low-level signals to the switching elements SM2 to SM7. When the high-level signal is output to the switching element SM1, the transistor M1 shown in FIG. 6 is connected to the reference voltage output unit 450. At that time, since the first control signals TM1, TM2, and TM3 having binary values of 0, 0, and 1 are input to the second selecting unit 432, the second selecting unit 432 outputs a low-level signal to the switching element SM8, which causes the transistor M8 to be disconnected from the reference voltage output unit 450.

The third selecting unit 441 of the second control unit 440 decodes the second control signals and outputs a high-level signal to the switching element SK1 and low-level signals to the switching elements SK2 to SK7. When the high-level signal is output to the switching element SK1, the transistor K1 shown in FIG. 6 is connected to the reference voltage output unit 450. At that time, since the second control signals TM4, TM5, and TM6 having binary values of 0, 0, and 1 are input to the fourth selecting unit 442, the fourth selecting unit 442 outputs a low-level signal to the switching element SK8, which causes the transistor K8 to be disconnected from the reference voltage output unit 450.

Therefore, the transistor M1 of the first adjusting unit 410 and the transistor K1 of the second adjusting unit 420 are connected to the reference voltage output unit 450, so that they perform current control operations according to their resistance values. As a result, the reference voltage VREF having a ZTC characteristic that is constant regardless of temperature is output.

In this embodiment, when the difference between the voltages is checked, the reference voltage adjusting operation is performed by using the reference transistors M8 and K8 of the first adjusting unit 410 and the second adjusting unit 420 only once by selecting the transistors whose resistance values are already known. Therefore, it is possible to obtain the reference voltage VREF satisfying the ZTC characteristic in one adjusting operation. However, in other cases, it is possible to obtain the reference voltage VREF satisfying the ZTC characteristic since only a simple change in control signal makes it possible to repeatedly perform the adjusting operation as well as independent control.

Although the present invention has been described in connection with the exemplary embodiments of the present invention, it will be apparent to those skilled in the art that various modifications and changes can be made without departing from the scope and spirit of the present invention. Therefore, it should be understood that the above embodiments are not limiting, but illustrative in all aspects. The scope of the present invention is defined by the appended claims rather than by the description preceding them, and all changes and modifications that fall within the metes and bounds of the claims, or equivalents of such metes and bounds are therefore intended to be embraced by the claims.

According to the exemplary embodiments of the present invention, the apparatus for generating a reference voltage in a semiconductor memory apparatus can simultaneously or independently adjust the output of a unit for generating a voltage proportional to temperature and the output of a unit for generating a voltage inversely proportional to temperature to generate a constant voltage regardless of a variation in temperature and mismatch between elements. Thus, the present invention can improve the performance and reliability of a system using the apparatus to a maximum.

What is claimed is:

1. An apparatus for generating a reference voltage in a semiconductor memory apparatus, comprising:
   a first voltage generating unit configured to generate a voltage proportional to temperature;
   a second voltage generating unit configured to generate a voltage inversely proportional to temperature;
   a reference voltage generating unit including a first adjusting unit coupled with the first voltage generating unit and a second adjusting unit coupled with the second voltage generating unit, configured to select the first adjusting unit or the second adjusting unit according to a difference between a reference voltage obtained by the first voltage generating unit and the second voltage generating unit and a target voltage, and adjust the reference voltage thereby outputting a constant reference voltage regardless of a variation in temperature, wherein the reference voltage generating unit further comprises:
   a control unit configured to output selection signals for controlling the first adjusting unit and the second adjusting unit wherein the control unit includes:
      a selecting unit configured to output the selection signals for adjusting the amount of current in the first adjusting unit or the amount of current in the second adjusting unit by a predetermined level on the basis of first control signals;
      a first signal output unit configured to output the selection signals to the first adjusting unit or the second adjusting unit on the basis of a second control signal;
      a second signal output unit configured to output a first reference selection signal to the first adjusting unit on the basis of the first control signals and the second control signal; and
      a third signal output unit configured to output a second reference selection signal to the second adjusting unit on the basis of the first control signals and the second control signal; and
   a reference voltage output unit configured to output the reference voltage based on the amount of current adjusted by the first adjusting unit and the amount of current adjusted by the second adjusting unit.

2. The apparatus for generating a reference voltage in a semiconductor memory apparatus of claim 1,
   wherein the selecting unit is a decoder.

3. The apparatus for generating a reference voltage in a semiconductor memory apparatus of claim 1,
   wherein the first signal output unit includes:
   a first transfer element configured to output the selection signal to the second adjusting unit on the basis of the second control signal; and
   a second transfer element configured to output the selection signal to the first adjusting unit on the basis of the second control signal.

4. The apparatus for generating a reference voltage in a semiconductor memory apparatus of claim 3,
   wherein the first and second transfer elements are pass gates.

5. The apparatus for generating a reference voltage in a semiconductor memory apparatus of claim 1,
   wherein the number of first signal output units is equal to a number of bits of the selection signal.

6. The apparatus for generating a reference voltage in a semiconductor memory apparatus of claim 1,
   wherein the first control signals are composed of a combination of two or more test mode signals.

7. The apparatus for generating a reference voltage in a semiconductor memory apparatus of claim 1,
   wherein, when the first control signals have specific values and when the second adjusting unit is selected by the second control unit, the second signal output unit outputs the first reference selection signal to the first adjusting unit.

8. The apparatus for generating a reference voltage in a semiconductor memory apparatus of claim 1,
   wherein the second signal output unit includes:
   a first NOR gate configured to receive the first control signals as input and having an output; and
   a second NOR gate configured to receive the output of the first NOR gate and the second control signal as input and to output a logical value thereof to a switching element.

9. The apparatus for generating a reference voltage in a semiconductor memory apparatus of claim 1,
   wherein, when the first control signals have specific values and when the first adjusting unit is selected by the second control unit, the third signal output unit outputs the second reference selection signal to the second adjusting unit.

10. The apparatus for generating a reference voltage in a semiconductor memory apparatus of claim 1,
    wherein the third signal output unit includes:

a first NOR gate configured to receive the first control signals as input and having an output; and
a second NOR gate configured to receive the output of the first NOR gate and an inverted signal of the second control signal as inputs and to output a logical value thereof to a switching element.

11. The apparatus for generating a reference voltage in a semiconductor memory apparatus of claim 1,
wherein the first voltage generating unit includes a reference voltage output terminal and a power supply terminal and the first adjusting unit includes a plurality of current control elements connected between the reference voltage output terminal and the power supply terminal through the switching elements.

12. The apparatus for generating a reference voltage in a semiconductor memory apparatus of claim 11,
wherein the plurality of current control elements have different resistance values.

13. The apparatus for generating a reference voltage in a semiconductor memory apparatus of claim 11,
wherein the plurality of current control elements are connected in series to one another either in an ascending or descending order of resistance values.

14. The apparatus for generating a reference voltage in a semiconductor memory apparatus of claim 11,
wherein the plurality of current control elements are transistors.

15. The apparatus for generating a reference voltage in a semiconductor memory apparatus of claim 1,
wherein the second adjusting unit includes a plurality of current control elements connected with the second voltage generating unit and a plurality of switching elements connected between the current controls elements and the reference voltage output unit corresponding to the current control elements.

16. The apparatus for generating a reference voltage in a semiconductor memory apparatus of claim 15,
wherein the plurality of current control elements have different resistance values.

17. The apparatus for generating a reference voltage in a semiconductor memory apparatus of claim 15,
wherein the plurality of current control elements are connected in series to one another either in an ascending or descending order of resistance values.

18. The apparatus for generating a reference voltage in a semiconductor memory apparatus of claim 15,
wherein the plurality of current control elements are transistors.

19. The apparatus for generating a reference voltage in a semiconductor memory apparatus of claim 1,
wherein the reference voltage output unit includes a resistor having one end connected to both the first adjusting unit and the second adjusting unit and an other end connected to ground.

20. An apparatus for generating a reference voltage in a semiconductor memory apparatus, comprising:
a first voltage generating unit configured to generate a voltage proportional to temperature;
a second voltage generating unit configured to generate a voltage inversely proportional to temperature; and
a reference voltage generating unit including a first adjusted unit coupled with the first voltage generating unit and a second adjusting unit coupled with the second voltage generating unit, configured to operate both the first adjusting unit and the second adjusting unit according to a difference between a reference voltage obtained by the first voltage generating unit and the second voltage generating unit and a target voltage, and adjust the reference voltage, thereby outputting a constant reference voltage regardless of a variation in temperature,
wherein the first adjusting unit is configured to finely adjust the reference voltage and the second adjusting unit is configured to coarsely adjust the reference voltage.

21. The apparatus for generating a reference voltage in a semiconductor memory apparatus of claim 20,
wherein the reference voltage generating unit further comprises:
a first control unit configured to output selection signals for controlling the first adjusting unit;
a second control unit configured to output selection signals for controlling the second adjusting unit; and
a reference voltage output unit that outputs the reference voltage based on the amount of current adjusted by the first adjusting unit and the amount of current adjusted by the second adjusting unit.

22. The apparatus for generating a reference voltage in a semiconductor memory apparatus of claim 21,
wherein the first voltage generating unit includes a reference voltage output terminal and a power supply terminal and the first adjusting unit includes a plurality of current control elements connected between the reference voltage output terminal and the power supply terminal through switching elements.

23. The apparatus for generating a reference voltage in a semiconductor memory apparatus of claim 22,
wherein the plurality of current control elements have different resistance values.

24. The apparatus for generating a reference voltage in a semiconductor memory apparatus of claim 22,
wherein the plurality of current control elements are connected in series to one another either in an ascending or descending order of resistance values.

25. The apparatus for generating a reference voltage in a semiconductor memory apparatus of claim 22,
wherein the plurality of current control elements are transistors.

26. The apparatus for generating a reference voltage in a semiconductor memory apparatus of claim 21,
wherein the second adjusting unit includes a plurality of current control elements connected with the second voltage generating unit and a plurality of switching elements connected between the current control elements and the reference voltage output unit corresponding to the current elements.

27. The apparatus for generating a reference voltage in a semiconductor memory apparatus of claim 26,
wherein the plurality of current control elements have different resistance values.

28. The apparatus for generating a reference voltage in a semiconductor memory apparatus of claim 26,
wherein the plurality of current control elements are connected in series to one another either in an ascending or descending order of resistance values.

29. The apparatus for generating a reference voltage in a semiconductor memory apparatus of claim 26,
wherein the plurality of current control elements are transistors.

30. The apparatus for generating a reference voltage in a semiconductor memory apparatus of claim 21,
wherein the first control unit includes:
a first selecting unit configured to output selection signals for adjusting the amount of current in the first adjusting unit by a predetermined level on the basis of the first control signals; and a second selecting unit configured to output a first reference selection signal on the basis of the first control signals.

31. The apparatus for generating a reference voltage in a semiconductor memory apparatus of claim 30,
wherein the first selecting unit is a decoder configured to decode the first control signals and outputs the selection signals.

32. The apparatus for generating a reference voltage in a semiconductor memory apparatus of claim 30,
wherein the second selecting unit is a NOR gate configured to receive the first control signals as input and to output the first reference selection signal on the basis the received first control signals.

33. The apparatus for generating a reference voltage in a semiconductor memory apparatus of claim 21,
wherein the second control unit includes:
a first selecting unit configured to output selection signals for adjusting the amount of current in the second adjusting unit by a predetermined level on the basis of the second control signals; and
a second selecting unit configured to output a second reference selection signal on the basis of the second control signals.

34. The apparatus for generating a reference voltage in a semiconductor memory apparatus of claim 33,
wherein the first selecting unit is a decoder configured to decode the second control signals and to output the selection signals.

35. The apparatus for generating a reference voltage in a semiconductor memory apparatus of claim 33,
wherein the second selecting unit is a NOR gate configured to receive the second control signals as input and to output the second reference selection signal on the basis of the received second control signals.

36. The apparatus for generating a reference voltage in a semiconductor memory apparatus of claim 21,
wherein the reference voltage output unit includes a resistor having one end connected to both the first adjusting unit and the second adjusting unit and the other end connected to the ground.

\* \* \* \* \*